(12) United States Patent
Komurasaki et al.

(10) Patent No.: US 7,362,194 B2
(45) Date of Patent: Apr. 22, 2008

(54) OSCILLATOR CIRCUIT AND L LOAD DIFFERENTIAL CIRCUIT ACHIEVING A WIDE OSCILLATION FREQUENCY RANGE AND LOW PHASE NOISE CHARACTERISTICS

(75) Inventors: Hiroshi Komurasaki, Hyogo (JP); Tomohiro Sano, Hyogo (JP); Hisayasu Sato, Hyogo (JP); Toshio Kumamoto, Hyogo (JP); Yasushi Hashizume, Hyogo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 0 days.

(21) Appl. No.: 11/707,937

(22) Filed: Feb. 20, 2007

(65) Prior Publication Data

US 2007/0146089 A1 Jun. 28, 2007

Related U.S. Application Data

(62) Division of application No. 11/280,410, filed on Nov. 17, 2005, now Pat. No. 7,202,754, which is a division of application No. 10/644,865, filed on Aug. 21, 2003, now abandoned.

(30) Foreign Application Priority Data

Mar. 4, 2003 (JP) .............................. 2003-056952

(51) Int. Cl.
*H03B 5/18* (2006.01)
(52) U.S. Cl. .............. 331/181; 331/116 M; 331/117 R; 331/167
(58) Field of Classification Search ................ 331/181, 331/117 R, 116 M, 167
See application file for complete search history.

(56) References Cited

U.S. PATENT DOCUMENTS

| 4,638,263 A | 1/1987 | van Rumpt et al. |
| 4,670,662 A | 6/1987 | Goldstein et al. |
| 5,872,489 A | 2/1999 | Chang et al. |

(Continued)

FOREIGN PATENT DOCUMENTS

DE  3844393  7/1990

(Continued)

OTHER PUBLICATIONS

Akihiro Yamagishi et al., "A Low-Voltage 6-GHz-Band CMOS Monolithic LC-Tank VCO Using a Tuning-Range Switching Technique," IEICE Trans. Fundamentals, vol. E84-A, No. 2, Feb. 2001, pp. 559-562.

(Continued)

*Primary Examiner*—Joseph Chang
(74) *Attorney, Agent, or Firm*—Buchanan Ingersoll & Rooney PC

(57) ABSTRACT

An oscillator circuit is formed of a differential LC resonant circuit formed of an L load differential circuit including inductance-variable portions and a capacitor element, and a positive feedback circuit formed of N-channel MOS transistors. The inductance-variable portion is configured to vary the inductance by selecting a plurality of switch circuits arranged between a plurality of arbitrary positions on a spiral interconnection layer and the input/output terminal, and thereby can control an oscillation frequency. The inductance-variable portions form an inductor pair when the switch circuit among the switch circuits coupled between the first input/output terminals is turned on together with the switch circuit.

1 Claim, 8 Drawing Sheets

U.S. PATENT DOCUMENTS

| | | |
|---|---|---|
| 6,218,909 B1 | 4/2001 | Eban |
| 6,437,653 B1 | 8/2002 | Cruz et al. |
| 6,593,825 B1 | 7/2003 | Washburn |
| 6,597,248 B2 | 7/2003 | Shirai |
| 6,664,863 B1 | 12/2003 | Okamoto et al. |
| 2003/0146799 A1 | 8/2003 | Muramatsu et al. |

FOREIGN PATENT DOCUMENTS

| | | |
|---|---|---|
| DE | 69807622 | 4/1999 |
| JP | 7-142258 | 6/1995 |
| JP | 8-162331 | 6/1996 |
| JP | 9035942 | 2/1997 |
| KR | 2002-84776 | 11/2002 |
| WO | 00/76057 | 12/2000 |

OTHER PUBLICATIONS

T. Ohnakado et al., "A 1.4dB Insertion-Loss, 5GHz Transmit/Receive Switch Utilizing Novel Depletion-Layer-Extended Transistors (DETs) in 0.18 μm CMOS Process," IEEE Symposium on VLSI Technology Digest of Technical Papers, Jun. 2002, 16.4, pp. 162-163.

Chinese Office Action dated Apr. 20, 2007(with English Translation).

OSCILLATOR CIRCUIT AND L LOAD DIFFERENTIAL CIRCUIT ACHIEVING A WIDE OSCILLATION FREQUENCY RANGE AND LOW PHASE NOISE CHARACTERISTICS

CROSS REFERENCE TO RELATED APPLICATIONS

This application is a Divisional application of application Ser. No. 11/280,410, filed Nov. 17, 2005, now U.S. Pat. No. 7,202,754 which in turn is a Divisional application of application Ser. No. 10/644,865, filed Aug. 21, 2003 now abandoned.

BACKGROUND OF THE INVENTION

1. Field of the Invention

The present invention relates to an oscillator circuit and an L load differential circuit, and particularly to an oscillator circuit using an LC resonant circuit as well as an L load differential circuit mountable on the oscillator circuit.

2. Description of the Background Art

In wireless devices such as a cellular phone, a local oscillator circuit is used for frequency conversion of received signals into low-frequency signals allowing demodulation and for frequency conversion of send signals (i.e., signals to be sent) into high-frequency signals, and is required to have a wide oscillation frequency range and can lower noises (phase noises) at and around an oscillation frequency.

A Voltage Control Oscillator (VCO), which is a kind of local oscillator circuit, utilizes an oscillation phenomenon caused by positive feedback of the circuit, and can control the oscillation frequency by a control signal. In general, the VCO employs a resonant circuit or utilizes a delay time of a circuit.

In connection with the VCO utilizing the resonant circuit, a negative conductance LC oscillator circuit is known as an oscillator circuit utilizing negative resistance characteristics of a positive feedback circuit formed of transistors, as disclosed, e.g., in A. Yamagishi et al., "A Low-Voltage 6-GHz-Band CMOS Monolithic LC-Tank VCO Using a Tuning-Range Switching Technique", IEICE Trans. Fundamentals, vol. E84-A, No. 2, Feb. 2001. Since this oscillator circuit uses the LC resonant circuit including an inductor element and a capacitor element, it can achieve good phase noise characteristics, and application to VCOs for portable cordless devices has been expected.

A structure and an operation of a conventional VCO will now be described in connection with, e.g., a negative conductance LC oscillator circuit.

A conventional VCO is formed of an LC resonant circuit formed of two inductor elements and two diode elements, and a positive feedback circuit formed of two transistors each having a gate connected to a drain of the other.

In this structure, an input impedance $R_{in}$ of the positive feedback circuit is equal to $-2/g_m$ ($R_{in}=-2/g_m$) where $g_m$ represents a mutual conductance of each transistor. Therefore, the VCO oscillates when an absolute value $|R_{in}|$ of the input impedance is equal to or lower than an equivalent parallel resistance of the resonant circuit. Assuming that inductances L1 and L2 of the two inductor elements are both equal to L (i.e., L1=L2=L) and a variable junction capacitance is equal to $C_{var}$, an oscillation frequency $f_{osc}$ is expressed by the following formula (1):

$$f_{osc} = \frac{1}{2\pi\sqrt{LC_{var}}} \quad (1)$$

Accordingly, oscillation frequency $f_{osc}$ can be controlled in accordance with junction capacitance $C_{var}$ varied by the control voltage connected to the diode element.

An oscillation amplitude $A_{osc}$ of the VCO is expressed by the following formula (2), and takes the value proportional to oscillation frequency $f_{osc}$.

$$A_{osc} \propto 2\pi f_{osc} L \quad (2)$$

When the LC resonant circuit included in the VCO having the above differential structure is to be used for 1 to 2 GHz, an LC type using a lumped constant is predominantly employed because it can reduce an area of an integrated structure. A variable capacitance (varactor diode) is predominantly used as the capacity element. The inductor element is formed of a spiral inductance, which is formed of a spiral interconnection and a leader interconnection, and is generally formed on the same substrate as the transistor elements.

Accordingly, the inductance of the inductor element is uniquely determined in accordance with the form of the spiral, and cannot be adjusted unless a mask design is changed.

Meanwhile, the transistor elements formed on the same substrate do not necessarily exhibit designed characteristics due to variations in manufacturing steps. Therefore, inductance mismatching occurs between the inductor elements, which reduces yield.

Recently, many kinds of inductance-variable elements, of which inductance can be varied even after the inductor elements are assembled in circuits, have been proposed, e.g., in Japanese Patent Laying-Open Nos. 7-142258 and 8-162331.

For example, the inductance-variable element disclosed in Japanese Patent Laying-Open No. 7-142258 includes a spiral electrode formed on a semiconductor substrate with an insulating film therebetween and switch circuits for short-circuiting various turn portions of the spiral electrode.

In this structure, when the switch circuit is turned on in response to a predetermined applied voltage, the corresponding turn portion of the spiral electrode is locally short-circuited. This changes the number of turns of the inductance-variable element so that the inductance-variable element changes its inductance as a whole.

As already described, oscillation frequency $f_{osc}$ in the conventional VCO is controlled by variable capacitance $C_{var}$. However, the equivalent parallel resistance of the LC resonant circuit lowers with increase in variable capacitance $C_{var}$. Therefore, VCO may deviate from an oscillation state if the capacitance value is high. Accordingly, it is difficult to achieve a wide oscillation frequency range.

Further, oscillation amplitude $A_{osc}$ of the VCO is proportional to oscillation frequency $f_{osc}$. In a low frequency range, therefore, oscillation amplitude $A_{osc}$ is low, and a signal-to-noise ratio of the oscillation signal is low so that the phase noise characteristics are impaired.

The foregoing inductance-variable element suffers from such a problem that the Q value lowers due to an on-resistance of a switch circuit connected in series to the inductor element. This results in deterioration of the phase noise characteristics of the oscillator circuit formed of the inductor element.

SUMMARY OF THE INVENTION

An object of the invention is to provide an oscillator circuit having a wide oscillation frequency range and characteristics achieving low phase noises.

Another object of the invention is to provide an L load differential circuit, which is mounted on the oscillator circuit, and achieves the above performance.

According to an aspect of the invention, an oscillator circuit performs oscillation by positive feedback of an LC resonant circuit, and the LC resonant circuit includes a parallel resonant circuit that is formed of an inductance-variable portion allowing variation of an inductance by a switch circuit and a capacitor element.

According to another aspect of the invention, an oscillator circuit is formed of a pair of transistors cross-coupled to each other, and an LC resonant circuit of a differential type coupled to the pair of transistors in a feedback manner. The LC resonant circuit includes first and second inductance-variable portions including first and second input/output terminals, commonly connected at their second terminals to a fixed node and being capable of varying inductances, and a first switch circuit coupled between the first input/output terminals of the first and second inductance-variable portions. Each of the first and second inductance-variable portions has a spiral interconnection layer starting from the first input/output terminal and formed on a semiconductor substrate with an interlayer insulating film therebetween, and a plurality of second switch circuits having first terminals connected to arbitrary positions on the interconnection layer and second terminals commonly connected to the second input/output terminal, respectively. When one of the second switch circuits is turned on, the oscillator circuit electrically couples the connection position of the turned-on second switch circuit on the interconnection layer to the second input/output terminal. When the first switch circuit is turned on in response to the turn-on of the second switch circuit, the first switch circuit electrically couples the first and second inductance-variable portions.

According to the invention described above, since the oscillation frequency of the oscillator circuit is controlled by varying the inductance of the LC resonant circuit, it is possible to achieve the oscillator circuit, which can prevent deterioration of the phase noise characteristics in a low oscillation frequency range, and can achieve a wide oscillation frequency range and characteristics ensuring low phase noises.

Further, the two inductance-variable portions included in the differential LC resonant circuit are electrically coupled to form an inductor pair by the switch circuit arranged between the inductance-variable portions. Thereby, it is possible to suppress deterioration of a Q value of the resonant circuit, and the voltage control oscillator circuit can have characteristics ensuring low phase noises. If the differential LC resonant circuit is configured not to connect a capacitor element thereto, it can be used as an L load differential circuit having a high Q value and a variable inductance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same reference numbers indicate the same or corresponding portions.

First Embodiment

Figure 1:
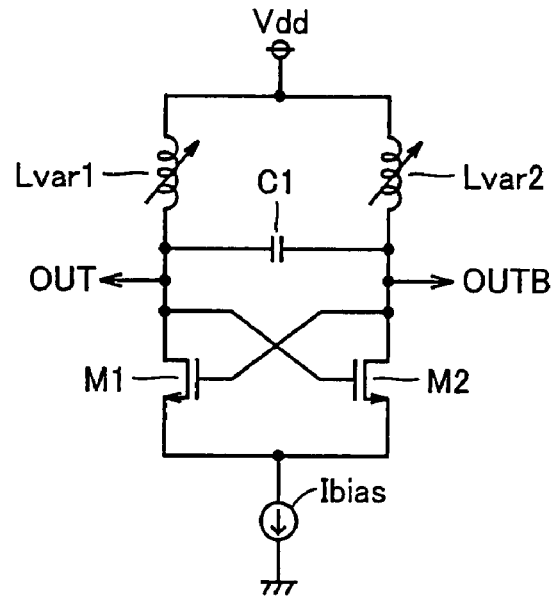
FIG. 1 shows by way of example an oscillator circuit according to a first embodiment of the invention.

FIG. 1 shows a structure of an oscillator circuit according to a first embodiment of the invention. In the following description of the embodiment, a voltage control oscillator circuit will be described as an example of the oscillator circuit.

Referring to FIG. 1, a voltage control oscillator circuit is formed of a differential type LC resonant circuit, which is formed of inductance-variable portions Lvar1 and Lvar2 having variable inductances and a capacitor element C1, and a positive feedback circuit formed of N-channel MOS transistors M1 and M2.

Each of inductance-variable portions Lvar1 and Lvar2 has first and second input/output terminals, and the second input/output terminal is commonly connected to an external power supply node Vdd. The first input/output terminals are connected to output nodes OUT and OUTB, respectively. Capacitor element C1 is connected between the first input/output terminals of inductance-variable portions Lvar1 and Lvar2. An oscillation frequency $f_{osc}$ of the voltage control oscillator circuit can be determined based on the inductance values of the inductance-variable portions and the capacitance value.

The positive feedback circuit includes N-channel MOS transistor M1 electrically coupled between inductance-variable portion Lvar1 and a constant current supply Ibias, and N-channel MOS transistor M2 electrically coupled between inductance-variable portion Lvar2 and constant current supply Ibias.

N-channel MOS transistors M1 and M2 have gates each coupled to a drain of the other, and thus provide a cross-coupled structure.

An operation of the voltage control oscillator circuit shown in FIG. 1 will now be described.

Referring to FIG. 1, since the positive feedback circuit of the voltage control oscillator circuit can be deemed as a two-terminal circuit, an input impedance $R_{in}$ viewed from the drains of N-channel MOS transistors M1 and M2 can be expressed as $R_{in}=-2/g_m$, where $g_m$ is a mutual conductance of each N-channel MOS transistor. Therefore, this circuit oscillates when an absolute value $|R_{in}|$ of input impedance $R_{in}$ is equal to or lower than a value of an equivalent parallel resistance of the LC resonant circuit. This circuit may be referred to as a "negative conductance LC oscillator circuit".

When the circuit satisfies the foregoing oscillation conditions, oscillation frequency $f_{osc}$ is expressed by the following formula (3), where L indicates an inductance value of inductance-variable portions Lvar1 and Lvar2, and $C_1$ indicates a capacitance value of capacitor element C1. Parasitic capacitances of the respective passive elements, interconnections and others are ignored.

$$f_{osc} = \frac{1}{2\pi\sqrt{LC_1}} \quad (3)$$

An oscillation amplitude $A_{OSC}$ is expressed by the following formula (4):

$$A_{osc} \propto 2\pi f_{osc} L \quad (4)$$

As can be seen from the formula (3), oscillation frequency $f_{osc}$ changes in accordance with inductance value L. For example, oscillation frequency $f_{osc}$ lowers with increase in inductance value L. In this case, since oscillation frequency $f_{osc}$ is lowered in accordance with increase in inductance value L, deterioration of oscillation amplitude $A_{osc}$ expressed in FIG. (4) is prevented. Therefore, it is possible to avoid deterioration of the phase noise characteristics, which occurs due to lowering of the oscillation amplitude in a conventional VCO when the oscillation frequency is in a low range.

Then, description will be given on a specific example of the structures of inductance-variable portions Lvar1 and Lvar2 forming the LC resonant circuit in the voltage control oscillator circuit shown in FIG. 1.

Figure 2:
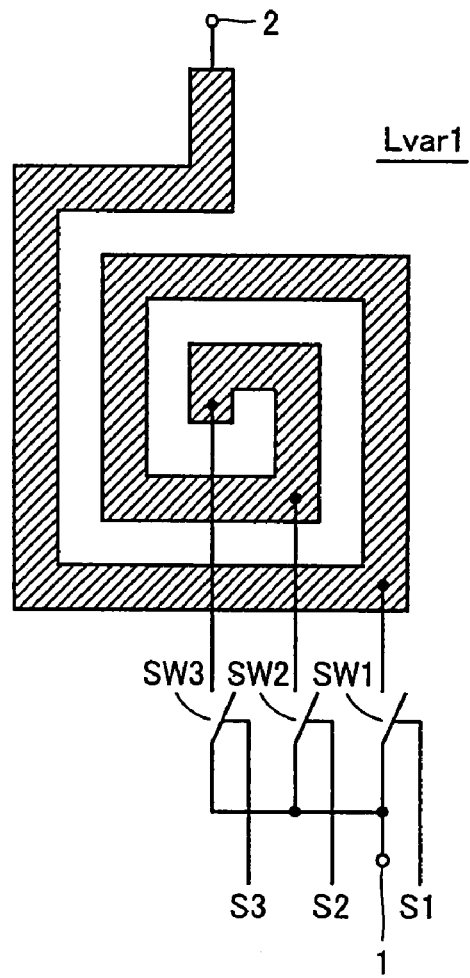
FIG. 2 schematically shows by way of example a structure of an inductance-variable portion.

FIG. 2 schematically shows by of example a structure of inductance-variable portions Lvar1 and Lvar2. Since inductance-variable portions Lvar1 and Lvar2 have the same structure, FIG. 2 representatively shows only inductance-variable portion Lvar1.

Referring to FIG. 2, inductance-variable portion Lvar1 includes a spiral interconnection layer formed on a semiconductor substrate (not shown) with an interlayer insulating film therebetween, and switch circuits SW1-SW3.

The spiral interconnection layer is made of a metal material such as aluminum or copper, and the configuration thereof is not restricted to a square, and may be another form such as a polygon or a circle.

Switch circuits SW1-SW3 have first terminals, which are connected to respective turns of the spiral interconnection layer, and second terminals connected to an input/output terminal of the inductor element. Switch circuits SW1-SW3 receive control signals for controlling the turning-on/off thereof.

Figure 3:
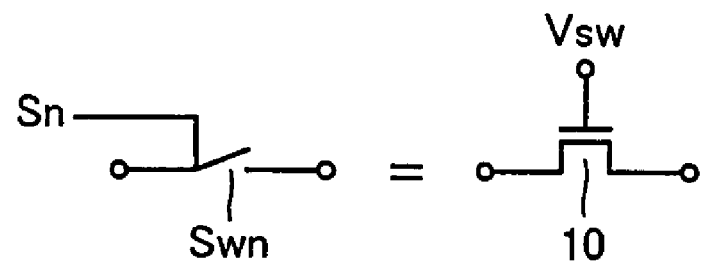
FIG. 3 shows by way of example a structure of a switch circuit.

FIG. 3 shows by way of example a structure of switch circuits SW1-SW3.

Referring to FIG. 3, switch circuit SWn (n=1, 2 or 3) may be formed of an N-channel MOS transistor 10. When N-channel MOS transistor 10 is supplied with a control voltage Vsw as a control signal Sn on its gate, it is turned on or off depending on the voltage level of control voltage Vsw. When control voltage Vsw is at a H-level (high potential level), N-channel MOS transistor 10 is turned on so that the corresponding portion of the spiral interconnection layer is electrically coupled to the input/output terminal of the inductor element. When control voltage Vsw is at a L-level (low potential level), N-channel MOS transistor 10 is turned off. Thereby, the corresponding portion of the spiral interconnection layer is electrically isolated from the input/output terminal of the inductor element.

Accordingly, one of the switch circuits is selected to receive control voltage Vsw at the H-level, and the other switch circuits are supplied with control voltage Vsw at L-level so that an intended inductance value can be obtained.

In the inductance-variable portion of the structure shown in FIG. 2, since switch circuits SW1-SW3 are provided for the respective turns of the spiral interconnection layer, discrete inductance values can be obtained.

In FIG. 3, the N-channel MOS transistor is used as the switch circuit. However, a bipolar transistor or a GaAs MESFET (Metal Semiconductor Field-Effect Transistor) may be used instead of the N-channel MOS transistor.

Figure 4:
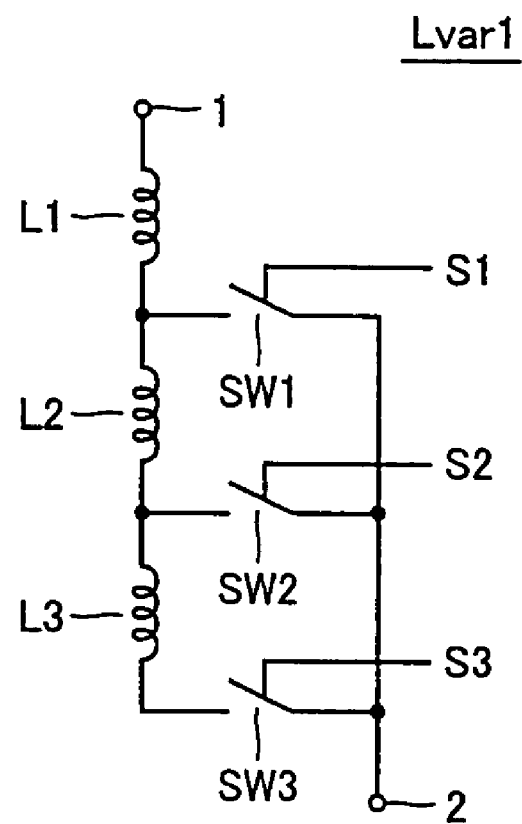
FIG. 4 is an equivalent circuit diagram of the inductance-variable portion in FIG. 2.

FIG. 4 is an equivalent circuit diagram of inductance-variable portion Lvar1 in FIG. 2.

Referring to FIG. 4, the inductance-variable portion is divided into three inductor elements L1, L2 and L3 by switch circuits SW1-SW3 arranged for the respective turns. It is assumed that inductor elements L1, L2 and L3 have inductance values of L1, L2 and L3, respectively.

For example, when switch circuit SW1 is on, the whole inductor elements have the inductance value of L1. When switch circuit SW2 is on, the whole inductor elements have the inductance value of (L1+L2). In this manner, one of switch circuits SW1-SW3 is turned on so that the inductance can selectively take the discrete values within a variable range from L1 to (L1+L2+L3).

Figure 5:
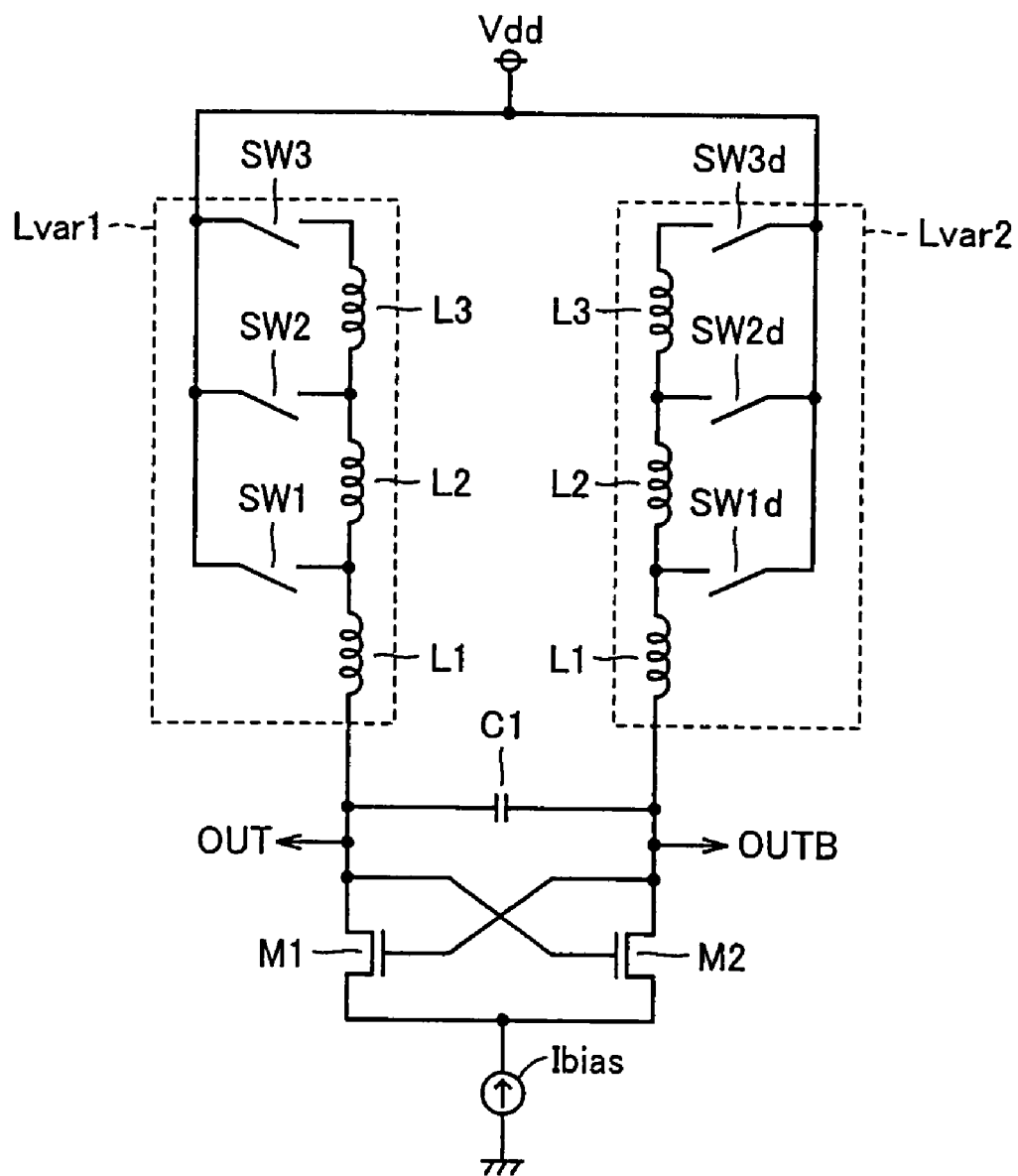
FIG. 5 shows a circuit structure of the voltage control oscillator circuit in FIG. 1 having inductance-variable portions Lvar1 and Lvar2 each formed of the inductance-variable portion shown in FIGS. 2 to 4.

FIG. 5 shows a circuit structure, in which each of inductance-variable portions Lvar1 and Lvar2 in the voltage control oscillator circuit shown in FIG. 1 employs the inductance-variable portion shown in FIGS. 2 to 4.

In the voltage control oscillator circuit in FIG. 5, inductance-variable portions Lvar1 and Lvar2 in the LC resonant circuit shown in FIG. 1 are expressed as the equivalent circuits shown in FIG. 4, and switch circuits SW1-SW3 and SW1d-SW3d are arranged for the respective turns. Capacitor element C1 in the LC resonant circuit and the circuit structure of the positive feedback circuit are similar to those of the VCO in FIG. 1, and therefore, description thereof is not repeated.

Switch circuits SW1 and SW1d form one switch circuit group. Likewise, switch circuits SW2 and SW2d form one switch circuit group, and switch circuits SW3 and SW3d form one switch circuit group.

In this structure, one switch circuit group is selected from the three switch circuit groups, and switch circuits SWn and SWnd in the selected group are turned on. The switch circuits in the other switch circuit groups are kept off. For example, when switch circuits SW1 and SW1d are turned on, each of inductance-variable portions Lvar1 and Lvar2 takes the inductance value of L1. Thus, by turning on one of the switch circuit groups, the inductance of the inductance-variable portion can be discretely varied within the variable range from L1 to (L1+L2+L3), as already described. As a result, the variable range of oscillation frequency $f_{osc}$ of the voltage control oscillator circuit can be expressed by the following formula (5):

$$\frac{1}{2\pi\sqrt{(L_1+L_2+L_3)C}} \leq f_{osc} \leq \frac{1}{2\pi\sqrt{L_1 C}} \quad (5)$$

Even in the low frequency range within the variable oscillation frequency range, oscillation amplitude $A_{osc}$ does not deteriorate owing to increase in inductance L so that deterioration of phase noises does not occur.

Therefore, the first embodiment of the invention can achieve the voltage control oscillator circuit having a wide oscillation frequency range and low-phase-noise characteristics, i.e., characteristics ensuring low phase noises.

Modification of First Embodiment

As described above, the oscillator circuit of the first embodiment includes the LC resonant circuit employing the inductance-variable portion for improving the trade-off relationship between the variable oscillation frequency range and the phase noise characteristics. The inductance-variable portion can easily provide various inductance values by switching the plurality of switch circuits provided for the spiral interconnection layer of the inductor element. A modification of the structure of the inductance-variable portion will now be described.

Figure 6:
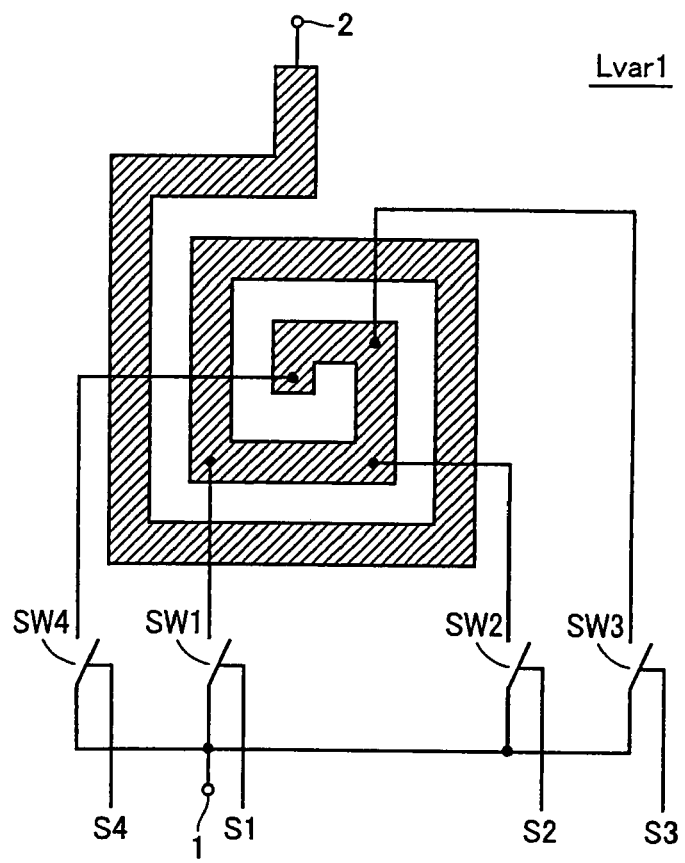
FIG. 6 schematically shows a structure of a first modification of the inductance-variable portion in FIGS. 2 and 4.

FIG. 6 schematically shows a structure of a first modification of inductance-variable portion Lvar1 shown in FIGS. 2 and 4. Inductance-variable portion Lvar2 has the same structure as inductance-variable portion Lvar1, and therefore description thereof is not repeated.

Referring to FIG. 6, inductance-variable portion Lvar1 includes switch circuits SW1-SW4 arranged for quarters of the turn of the spiral interconnection layer, respectively, and thus has a structure achieved by adding a switch circuit to the inductor element in FIGS. 2 and 4.

In this structure, an intended inductance can be likewise achieved by turning on one of switch circuits SW1-SW4. Further, by increasing the number of the switch circuits, it is possible to widen the variable range of the inductance value and to perform the control more finely.

Therefore, by mounting the inductance varying portion in FIG. 6 on the LC resonant circuit of the voltage control oscillator circuit shown in FIG. 1, it is possible to widen the variable range of oscillator frequency $f_{osc}$ and to perform the control more finely. The number of the switch circuits and the positions of connection to the spiral interconnection layer are not restricted to those of this embodiment, and can be arbitrarily changed so that an intended oscillation frequency can be achieved.

Further, lowering of oscillation amplitude $A_{osc}$ can be suppressed owing to a large inductance even in the low frequency range within the variable frequency range, and therefore deterioration of the phase noise characteristics can be avoided.

Second Modification of the First Embodiment

Figure 7:
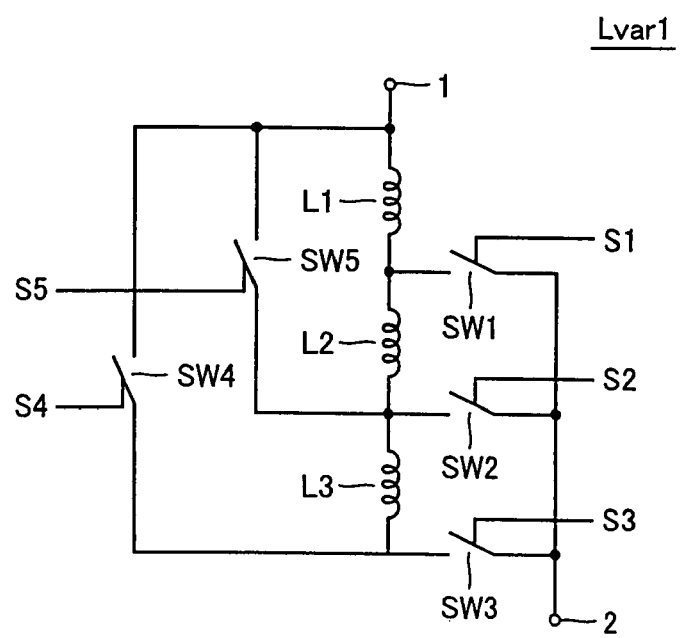
FIGS. 7 to 9 are circuit diagrams showing structures of second, third and fourth modifications of the inductance-variable portion shown in FIGS. 2 and 4, respectively.

FIG. 7 is an equivalent circuit diagram showing a structure of a second modification of inductance-variable portion Lvar1 shown in FIGS. 2 and 4.

Referring to FIG. 7, inductance-variable portion Lvar1 includes switch circuits SW4 and SW5 in addition to switch circuits SW1-SW3 arranged for respective turns in the equivalent circuit of the inductance-variable portion shown in FIG. 4.

Switch circuit SW4 is arranged between input/output terminals 1 and 2, and is connected in parallel with inductor elements L1-L3. Switch circuit SW5 is arranged between input/output terminal 1 and the terminal of switch circuit SW2, and is connected in parallel with inductor elements L1 and L2.

In this structure, switch circuits SW1-SW5 are selectively turned on so that the inductance can be varied more finely in stepwise fashion. For example, when only switch circuit SW1 is turned on, the inductance value of L1 is achieved. When only switch circuit SW2 is turned on, the inductance value is equal to (L1+L2). Likewise, when switch circuit SW3 is turned on, the inductance value is equal to (L1+L2+L3).

When switch circuits SW4 and SW5 are turned on, the inductance value is substantially equal to zero. When switch circuits SW5 and SW3 are turned on, the inductance value is equal to L3.

As described above, the inductance can be finely varied by variously combining the on and off states of the plurality of switch circuits. Therefore, by employing the inductance-variable portion in FIG. 7 in the LC resonant circuit of the voltage control oscillator circuit shown in FIG. 1, it is possible to widen the variable frequency range of oscillation frequency $f_{osc}$ and to perform the control more finely.

Third Modification of the First Embodiment

Figure 8:
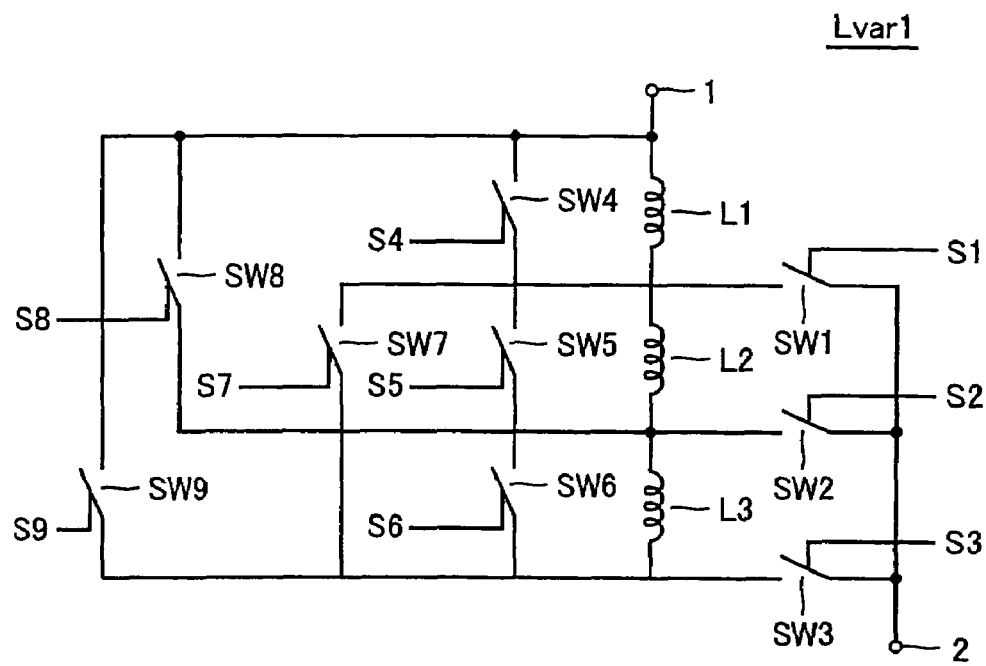

FIG. 8 shows a structure of a third modification of inductance-variable portion Lvar1 shown in FIGS. 2 and 4.

Referring to FIG. 8, inductance-variable portion Lvar1 includes switch circuits SW4-SW9 in addition to switch circuits SW1-SW3 provided for the respective turns in the equivalent circuit of the inductor element shown in FIG. 2.

Switch circuits SW4-SW6 are connected in parallel with inductor elements L1-L3, respectively. Switch circuit SW7 is connected between one end of inductor element L2 and one end of inductor element L3, and is arranged in parallel with inductor elements L2 and L3. Switch circuit SW8 is connected between one end of inductor element L1 and one end of inductor element L2, and is arranged in parallel with inductor elements L1 and L2. Switch circuit SW9 is connected between one end of inductor element L1 and one end of inductor element L3, and is arranged in parallel with inductor elements L1, L2 and L3.

In this structure, switch circuits SW1-SW9 are selectively turned on so that the inductance can be controlled more finely that the inductance-variable portion shown in FIGS. 2 and 7.

For example, when switch circuits SW2 and SW4 are turned on, the inductance value of L2 is obtained. When switch circuits SW3 and SW8 are turned on, the inductance value of L3 is obtained. When switch circuits SW3 and SW4 are turned on, the inductance value of (L2+L3) is obtained.

As described above, the inductance can be determined more finely in the variation range by combining the on/off states of the plurality of switch circuits. Therefore, by employing the inductance-variable portion shown in FIG. 8 in the LC resonant circuit of the voltage control oscillator circuit in FIG. 1, it is possible to widen the variable frequency range of oscillation frequency $f_{osc}$, and the control can be performed more finely.

Fourth Modification of the First Embodiment

Figure 9:
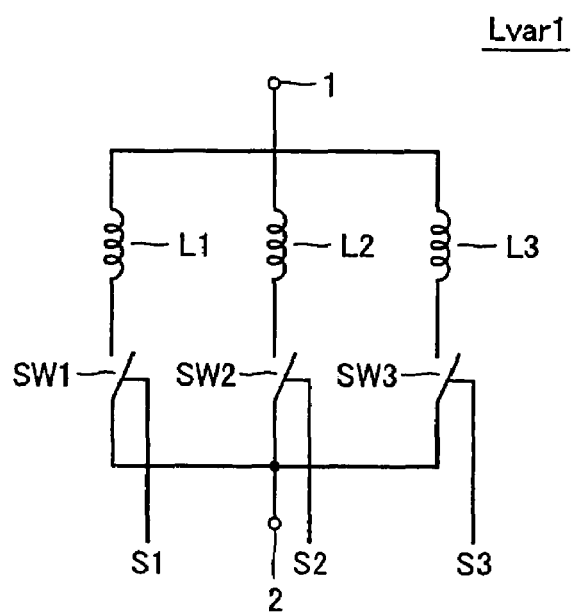

FIG. 9 is a circuit diagram showing a structure of a fourth modification of inductance-variable portion Lvar1 shown in FIG. 2.

Referring to FIG. 9, inductance-variable portion Lvar1 includes a plurality of inductor elements L1-L3 having different inductances, respectively, and switch circuits SW1-SW3 each coupled between one end of the spiral interconnection layer (not shown) of corresponding inductor element L1, L2 or L3 and the input/output terminal.

The inductance-variable portion in FIG. 2 has the plurality of switch circuits arranged for the one spiral interconnection layer. In contrast to this, the inductor element shown in FIG. 9 includes the switch circuits provided for the respective spiral interconnection layers in a one-to-one relationship. In the inductance-variable portion shown in FIG. 9, therefore, the inductance can be varied by turning on only the switch circuit, which corresponds to the inductor element having an intended inductance.

According to the inductance-variable portion having the above structure, the plurality of spiral interconnection layers are arranged in parallel, and therefore the circuit scale is large. However, the switch circuit per one inductor element is small in number so that the circuit structure can be simple.

Second Embodiment

Figure 10:
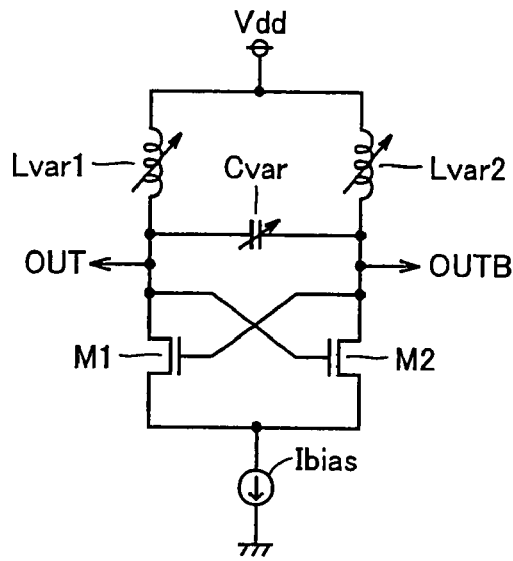
FIG. 10 is a circuit diagram showing by way of example a structure of an oscillator circuit according to a second embodiment of the invention.

FIG. 10 shows by way of example an oscillator circuit according to a second embodiment of the invention. Similarly to the first embodiment, a voltage control oscillator circuit will be described as an example of the oscillator circuit.

Referring to FIG. 10, the voltage control oscillator circuit differs from the voltage control oscillator circuit shown in FIG. 1 only in that the capacitor element forming the LC resonant circuit has a variable capacitance. Description of the same or corresponding portions is not repeated.

The LC resonant circuit is formed of inductance-variable portions Lvar1 and Lvar2 each connected between external power supply node Vdd and output node OUT or OUTB, and a variable capacitor element Cvar connected between first input/output terminals of inductor elements Lvar1 and Lvar2. In the following description, it is assumed that each passive element has an inductance of L and a capacitance value of C.

In this structure, oscillation frequency $f_{osc}$ of the voltage control oscillator circuit is expressed by the following formula (6), in which parasitic capacitances and others of each passive element, interconnection and others are ignored.

$$f_{osc} = \frac{1}{2\pi\sqrt{LC}} \quad (6)$$

Oscillation amplitude $A_{osc}$ is expressed by the following formula (7).

$$A_{osc} \propto 2\pi f_{osc} \cdot L \quad (7)$$

As can be seen from the formula (6), oscillation frequency $f_{osc}$ depends on a combination of two variables, i.e., inductance L and capacitance value C. Therefore, the variable range of the oscillation frequency can be wider than that in the voltage control oscillator circuit of the first embodiment, in which only the inductance is variable.

Since the oscillation frequency can be lowered by increasing inductance L similarly to the first embodiment, deterioration of oscillation amplitude $A_{osc}$ can be suppressed even in the low oscillation frequency range. Thereby, deterioration of the phase noise characteristics at the low oscillation frequencies can be suppressed so that the trade-off relationship between the variable range of the oscillation frequency and the phase noises can be improved.

Third Embodiment

Figure 11:
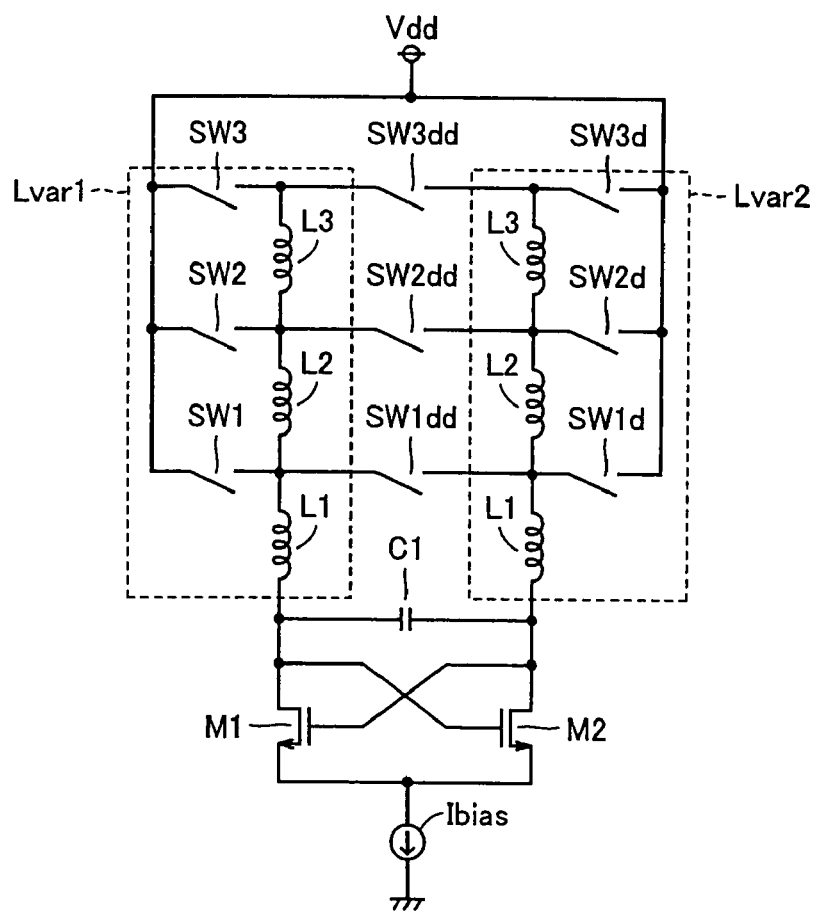
FIG. 11 is a circuit diagram showing by way of example a structure of an oscillator circuit according to a third embodiment of the invention.

FIG. 11 shows a structure of an oscillator circuit according to a third embodiment of the invention. A voltage control oscillator circuit will now be described as an example of an oscillator circuit.

Referring to FIG. 11, the voltage control oscillator circuit includes switch circuits SW1dd-SW3dd arranged between inductance-variable portions Lvar1 and Lvar2 of the differential LC resonant circuit, in addition to the components of the voltage control oscillator circuit of the first embodiment shown in FIG. 5. Description of the same or corresponding portions is not repeated.

Inductance-variable portions Lvar1 and Lvar2 include switch circuits SW1-SW3 or SW1d-SW3d arranged corresponding to the respective turns, similarly to inductance-variable portion Lvar1 shown in FIG. 2.

Further, a switch circuit SW1dd is arranged between switch circuits SW1 and SW1d. A switch circuit SW2dd is arranged between switch circuits SW2 and SW2d. A switch circuit SW3dd is arranged between switch circuits SW3 and SW3d. Switch circuits SW1, SW1d and SW1dd form one switch circuit group 1, switch circuits SW2, SW2d and SW2dd form a switch circuit group 2, and switch circuits SW3, SW3d and SW3dd form one switch circuit group 3.

By selecting one of switch circuit groups 1-3, switch circuits SWn, SWnd and SWndd (n=1, 2 or 3) forming the selected switch circuit group are all turned on. Consequently, inductance-variable portions Lvar1 and Lvar2 are electrically coupled to form an inductor pair.

Figure 12:
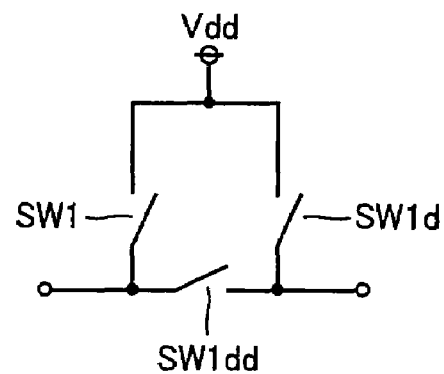
FIG. 12 is a circuit diagram schematically showing a structure of a switch circuit group 1 in a voltage control oscillator circuit in FIG. 11.

FIG. 12 schematically shows a structure of switch circuit group 1, 2 or 3 in the voltage control oscillator circuit shown in FIG. 11. Since the switch circuit groups 1-3 have the same structure, the structure of switch circuit group 1 will now be representatively described.

As shown in FIG. 12, switch circuits SW1 and SW1d are connected in parallel between external power supply node Vdd and inductor element L1. Further, switch circuit SW1dd is coupled between switch circuits SW1 and SW1d.

Effects by switch circuits SW1dd-SW3dd are as follows.

In the voltage control oscillator circuit shown in FIG. 11, one of the switch circuit groups is selected and turned on. For example, when switch circuit group 1 is selected, switch circuits SW1, SW1d and SW1dd are turned on. Thereby, the inductance equal to L1 is set in each of inductance-variable portions Lvar1 and Lvar2 arranged between external power supply node Vdd and respective output nodes OUT and OUTB.

Figure 13:
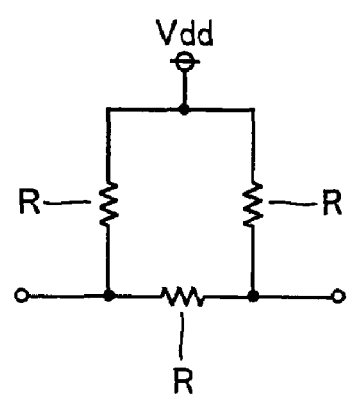
FIG. 13 is an equivalent circuit diagram of switch circuit group 1 in FIG. 12.

Further, inductance-variable portions Lvar1 and Lvar2 are in the state, where these portions are electrically coupled via switch circuit SW1dd. An equivalent circuit of only switch circuit group 1 in this state is shown in FIG. 13. A resistance element R is an on-resistance of each switch circuit.

Figure 14:
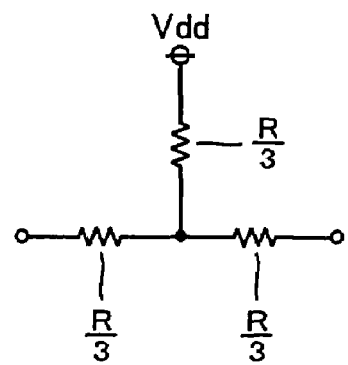
FIG. 14 is an equivalent circuit diagram of switch circuit group 1 changed from Δ-connection to Y-connection shown in FIG. 13.

In the equivalent circuit formed of three resistance elements R shown in FIG. 13, Δ-connection of resistance elements R may be changed into Y-connection, whereby switch circuit group 1 changes into an equivalent circuit shown in FIG. 14. As shown in FIG. 14, each of the three resistance elements forming the equivalent circuit has a resistance value of R/3. Therefore, a resistance component, which is connected in series to each of the inductor elements included in inductance-variable portions Lvar1 and Lvar2 in FIG. 11, has a resistance value of R/3.

Meanwhile, in each of the inductance-variable portions of the voltage control oscillator circuit shown in FIG. 5, a resistance component connected in series to the inductor element has the resistance value of R equal to the on-resistance of switch circuits SW1-SW3 and SW1d-SW3d. Thus, interposition of switch circuits SW1dd-SW3dd reduces the resistance values of resistance components to ⅓.

The Q value of the LC resonant circuit has such characteristics that the Q value of the LC resonant circuit rises with decrease in resistance component connected in series to the inductor element, and lowers with increase in resistance component. Therefore, the resonant circuit in the voltage control oscillator circuit of this embodiment can have a higher Q value than the LC resonant circuit in FIG. 5 owing to the reduction in resistance component by switch circuits SW1dd-SW3dd. This results in low-phase-noise characteristics of the voltage control oscillator.

The differential LC resonant circuit thus constructed can be applied not only to the voltage control oscillator circuit of this embodiment, but also can be applied to an RF circuit such as a differential amplifier and a mixer, which has a differential LC resonant circuit as a load for achieving high-gain characteristics and low-noise characteristics owing to a high Q value. Without connecting a capacitor element, the circuit may be used merely as an L load differential circuit in the RF circuit or the like, in which case a circuit having a variable gain can be achieved owing to the feature that the inductance value is variable.

Figure 15:
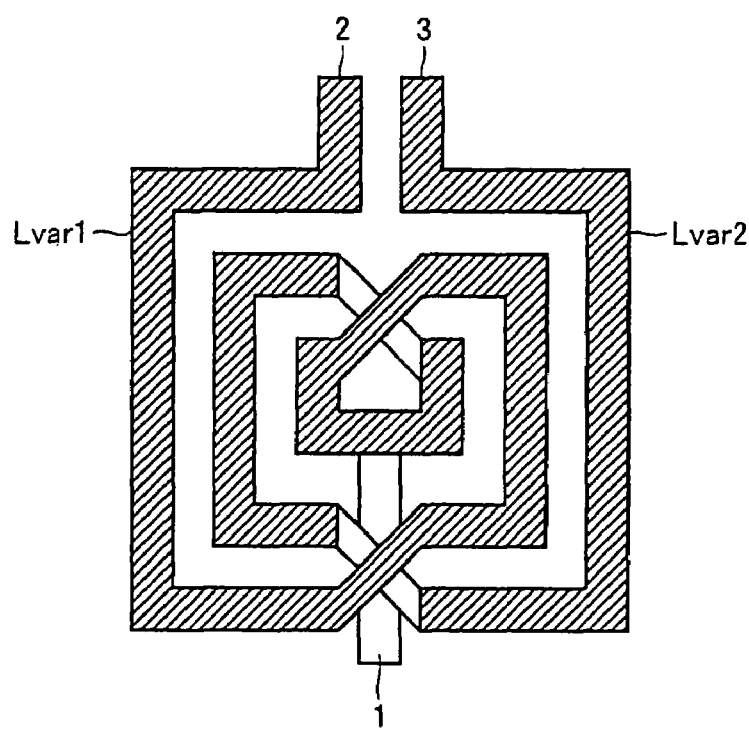
FIG. 15 shows a specific layout structure of inductance-variable portions Lvar1 and Lvar2 shown in FIG. 11.

FIG. 15 shows a specific layout structure of inductance-variable portions Lvar1 and Lvar2 in the differential LC resonant circuit included in the voltage control oscillator circuit shown in FIG. 11.

Referring to FIG. 15, inductance-variable portions Lvar1 and Lvar2 form a differential inductance including a combination of two spiral interconnection layers. Input/output terminal 1 common to the two inductance-variable portions is connected to external power supply node Vdd (not shown in FIG. 15). Other input/output terminals 2 and 3 of the inductance-variable portions are connected to output nodes OUT and OUTB of the voltage control oscillator circuit (not shown in FIG. 15), respectively.

By providing the two inductance-variable portions formed of the differential type inductors as shown in FIG. 15, switch circuits SW1dd-SW3dd can be interposed without increasing the circuit scale, and thus the structure can be compact.

According to the third embodiment of the invention, as described above, the two inductance-variable portions are electrically coupled by the switch circuits arranged therebetween to form the one inductor pair, and thereby the resistance component connected in series to the inductor element can be reduced so that deterioration of the Q value of the differential LC resonant circuit can be suppressed, and the voltage control oscillator circuit can have the characteristics ensuring low phase noises.

In the differential LC resonant circuit, the inductor pair is formed of the differential type inductors. Thereby, it is possible to suppress increase in circuit scale, which may be caused by interposition of the switch circuits, and the voltage control oscillator circuit can be compact in layout.

Modification of the Third Embodiment

Figure 16:
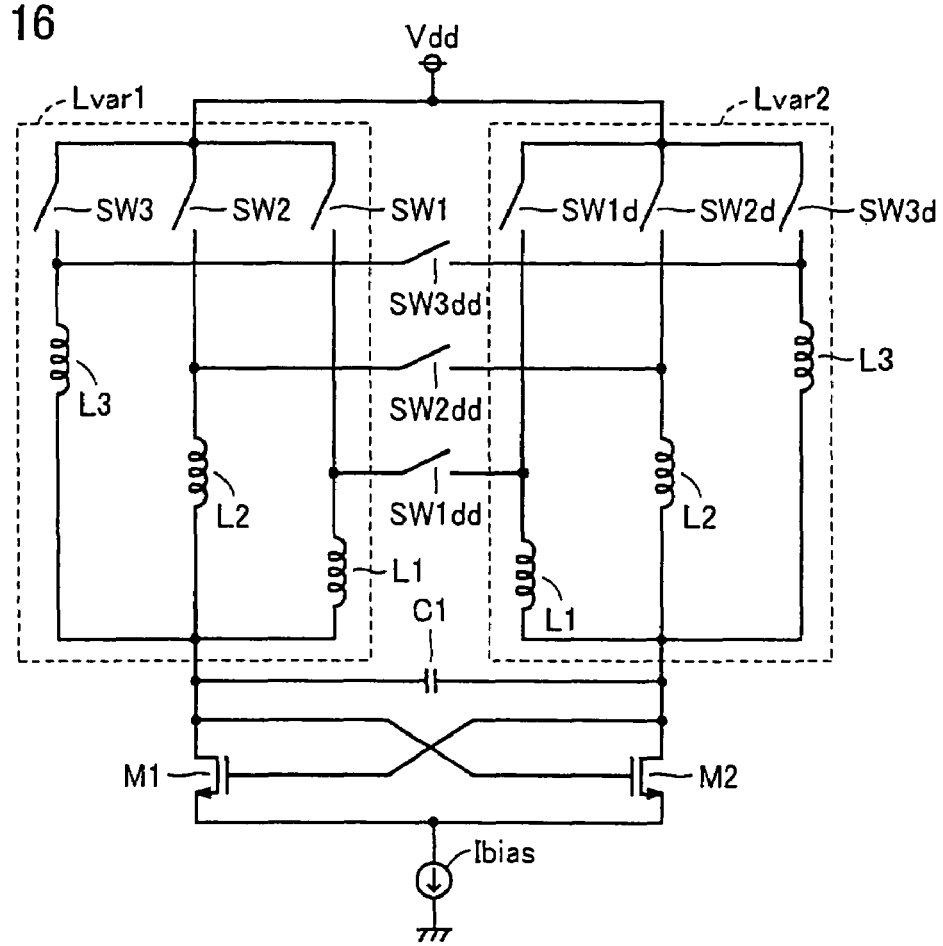
FIG. 16 is a circuit diagram showing by way of example a structure of an oscillator circuit according to a modification of the third embodiment of the invention.

FIG. 16 is a circuit diagram showing a structure of a voltage control oscillator circuit, which is an oscillator circuit according to a modification of the third embodiment of the invention.

Referring to FIG. 16, the voltage control oscillator circuit differs from the voltage control oscillator circuit shown in FIG. 11 in that the inductor pair included in the differential LC resonant circuit is formed of inductance-variable portions Lvar1 and Lvar2, each of which is formed of a plurality of inductor elements, and switch circuits SW1dd-SW3dd. Therefore, description of the portions corresponding to those of the voltage control oscillator circuit in FIG. 11 is not repeated.

The inductor pair is formed of two inductance-variable portions Lvar1 and Lvar2, which are arranged in parallel and are connected to external power supply node Vdd, and switch circuits SW1dd-SW3dd arranged between inductance-variable portions Lvar1 and Lvar2.

Inductance-variable portions Lvar1 and Lvar2 have the same structures as those shown in FIG. 9. Inductance-variable portion Lvar1 includes a plurality of inductor elements L1-L3, which are connected in parallel between external power supply node Vdd and output node OUT of the voltage control oscillator circuit, and have different inductances, respectively. Also, inductance-variable portion Lvar1 includes switch circuits SW1-SW3 coupled between respective inductor elements L1-L3 and external power supply node Vdd. Likewise, inductance-variable portion Lvar2 includes a plurality of inductor elements L1-L3, which are connected in parallel between external power supply node Vdd and output node OUTB of the voltage control oscillator circuit, and have different inductances, respectively, and switch circuits SW1d-SW3d coupled between respective inductor elements L1-L3 and external power supply node Vdd.

In this structure, an intended inductance can be achieved in each of inductance-variable portions Lvar1 and Lvar2 by turning on one of the plurality of switch circuits SW1-SW3 or SW1d-SW3d.

At the same time as the turn-on of switch circuits SWn and SWnd, corresponding one of switch circuits SW1dd-SW3dd arranged between the inductance-variable portions is turned on to form the inductor pair. Therefore, a resistance component, which is connected in series to each of the inductor elements, is reduced to R/3, as is done in the third embodiment. Thereby, a high Q value is achieved in the differential LC resonant circuit so that the voltage control oscillator circuit can have the characteristics ensuring the low-phase noises.

Similarly to the third embodiment, the differential LC resonant circuit thus constructed can also be applied to an RF circuit such as a differential amplifier and a mixer, and thereby high-gain characteristics and low-noise characteristics can be achieved owing to the high Q value. Without connecting the capacitor element, the circuit may be used merely as an L load differential circuit in the RF circuit or the like, in which case a circuit having a variable gain can be achieved owing to the feature that the inductance value is variable.

As already described in connection with the first to third embodiments, the oscillator circuit according to the invention can improve the trade-off relationship between the variable frequency range and the phase noise characteristics owing to the LC resonant circuit, which is configured to perform the control by the switch circuits arranged corresponding to the portions of the spiral interconnection layer, and thereby to provide the variable inductance values for controlling the oscillation frequency.

Further, according to the third embodiment, the differential LC resonant circuit includes the two inductance-variable portions, which are electrically coupled via the switch circuits to provide the inductor pair. Thereby, the resistance element connected in series to the inductor element is reduced, and the high Q value can be achieved. By arranging the resonant circuit thus constructed in the voltage control oscillator circuit, low-phase-noise characteristics can be achieved.

Since the insertion loss caused by the switch circuits still exerts a large influence on the Q value of the resonant circuit and the phase noise characteristics of the voltage control oscillator circuit, it is desired to lower further the insertion loss.

Accordingly, the switch circuit may be formed of a transistor such as a Depletion-layer-Extended Transistor (which may be referred to as a "DTE", hereinafter) capable of reducing an insertion loss, whereby the phase noise characteristics can be further improved.

The DTE has an element structure, which can be formed by removing a P-type well, $P^+$-isolation layer and a punch-through stopper layer from a conventional CMOS transistor, and achieves a low junction capacitance of source/drain electrodes and a high ground resistance so that a low insertion loss can be achieved. Specific element structures of the DTE are disclosed, e.g., in "A 1.4 dB Insertion-Loss, 5 GHz Transmit/Receive Switch Utilizing Novel Depletion-Layer-Extended Transistors (DETs) in 0.18 μm CMOS Process", T. Ohnakado, et al., IEEE Symposium on VLSI Technology Digest of Tech. Papers, 16.4, June 2002.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An oscillator circuit, comprising:
   a pair of transistors cross-coupled to each other; and
   an LC resonant circuit of a differential type coupled to said pair of transistors in a feedback manner; wherein
   said LC resonant circuit includes
   first and second inductance-variable portions including first and second input/output terminals, said second input/output terminals being commonly connected to a fixed node, and said first and second inductance-variable portions being capable of varying inductances, and
   a first switch circuit coupled between the first input/output terminals of said first and second inductance-variable portions,
   each of said first and second inductance-variable portions has
   a plurality of spiral interconnection layers starting from said first input/output terminal, and
   a plurality of second switch circuits coupled between trailing ends of said plurality of interconnection layers and said second input/output terminal, respectively,
   when one of said plurality of second switch circuits is turned on, the trailing end of said interconnection layer included in said plurality of interconnection layers and connected to said turned-on second switch circuit is electrically coupled to said second input/output terminal, and
   when said first switch circuit is turned on in response to the turn-on of said second switch circuit, said first switch circuit electrically couples said first and second inductance-variable portions.

* * * * *